(12) United States Patent
Sogai

(10) Patent No.: US 10,879,430 B2
(45) Date of Patent: *Dec. 29, 2020

(54) LIGHT-EMITTING DEVICE AND METHOD OF MANUFACTURING THE SAME

(71) Applicant: NICHIA CORPORATION, Anan (JP)

(72) Inventor: Takanobu Sogai, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/532,494

(22) Filed: Aug. 6, 2019

(65) Prior Publication Data

US 2019/0363222 A1 Nov. 28, 2019

Related U.S. Application Data

(63) Continuation of application No. 15/990,688, filed on May 28, 2018, now Pat. No. 10,418,528.

(30) Foreign Application Priority Data

May 30, 2017 (JP) ................................ 2017-107125

(51) Int. Cl.
*H01L 33/50* (2010.01)
*H01L 33/00* (2010.01)
(Continued)

(52) U.S. Cl.
CPC ............ *H01L 33/50* (2013.01); *H01L 33/005* (2013.01); *H01L 33/24* (2013.01); *H01L 33/505* (2013.01);
(Continued)

(58) Field of Classification Search
CPC ...................................................... H01L 33/50
See application file for complete search history.

(56) References Cited

U.S. PATENT DOCUMENTS

| 10,418,528 B2 * | 9/2019 | Sogai ...................... H01L 33/24 |
| 2003/0218180 A1 * | 11/2003 | Fujiwara ............... H01L 33/504 |
| | | 257/100 |
| 2014/0203306 A1 | 7/2014 | Ito | |

FOREIGN PATENT DOCUMENTS

| JP | 2010-283281 | 12/2010 |
| JP | 2013-168685 | 8/2013 |

(Continued)

OTHER PUBLICATIONS

Office Action with Form PTO-892 Notice of References Cited issued by the U.S. Patent and Trademark Office for the parent U.S. Appl. No. 15/990,688, dated Oct. 18, 2018.

(Continued)

*Primary Examiner* — William A Harriston
(74) *Attorney, Agent, or Firm* — Mori & Ward, LLP

(57) ABSTRACT

A light-emitting device includes a light-emitting element having a first upper surface serving as a light-extracting surface. A first light-transmissive member includes an inorganic material and a wavelength conversion member and has a plate shape including a first lower surface bonded to the first upper surface and a second upper surface. An outer periphery of the first lower surface is outside of an outer periphery of the first upper surface. The second upper surface is opposite to the first lower surface in a height direction along a height of the light-emitting device. The second light-transmissive member includes an inorganic material and includes a second lower surface bonded to the second upper surface and a third upper surface opposite to the second lower surface in the height direction. An outer periphery of the third upper surface is within an outer periphery of the second upper surface.

20 Claims, 8 Drawing Sheets

(51) Int. Cl.
    *H01L 33/24*     (2010.01)
    *H01L 33/36*     (2010.01)
    *H01L 33/60*     (2010.01)
    *H01L 33/54*     (2010.01)
    *H01L 33/56*     (2010.01)
    *H01L 33/62*     (2010.01)
    H01L 25/075     (2006.01)

(52) U.S. Cl.
    CPC ........ *H01L 33/507* (2013.01); *H01L 25/0753* (2013.01); *H01L 33/36* (2013.01); *H01L 33/501* (2013.01); *H01L 33/502* (2013.01); *H01L 33/54* (2013.01); *H01L 33/56* (2013.01); *H01L 33/60* (2013.01); *H01L 33/62* (2013.01); *H01L 2933/0033* (2013.01); *H01L 2933/0041* (2013.01); *H01L 2933/0058* (2013.01); *H01L 2933/0091* (2013.01)

(56) References Cited

FOREIGN PATENT DOCUMENTS

| | | |
|---|---|---|
| JP | 2014-143300 | 8/2014 |
| JP | 2014-207349 | 10/2014 |
| WO | WO 2014/081042 | 5/2014 |
| WO | WO 2014/122881 | 8/2014 |

OTHER PUBLICATIONS

Notice of Allowance issued by the United States Patent and Trademark Office for the parent U.S. Appl. No. 15/990,688, dated May 7, 2019.

* cited by examiner

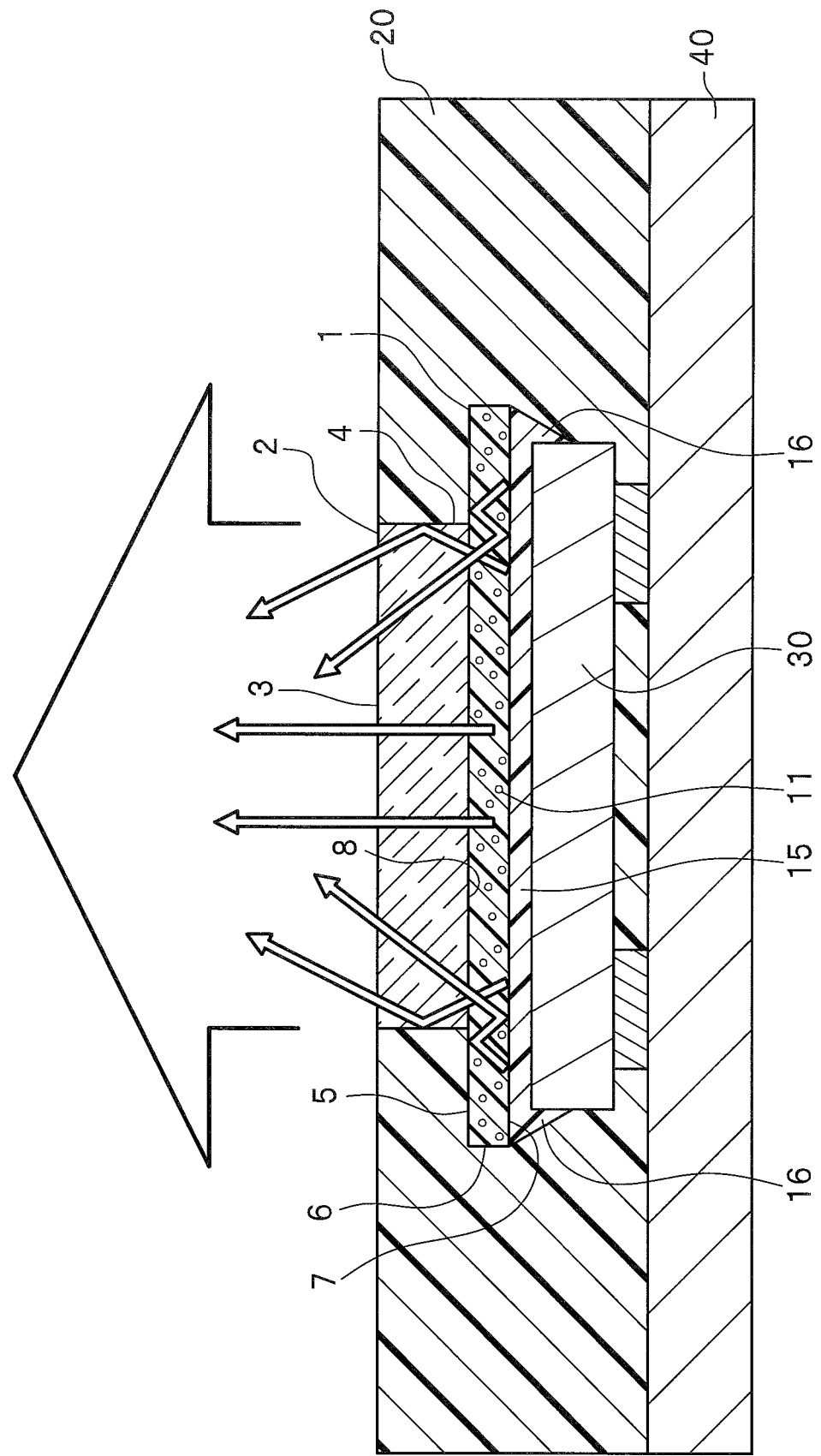

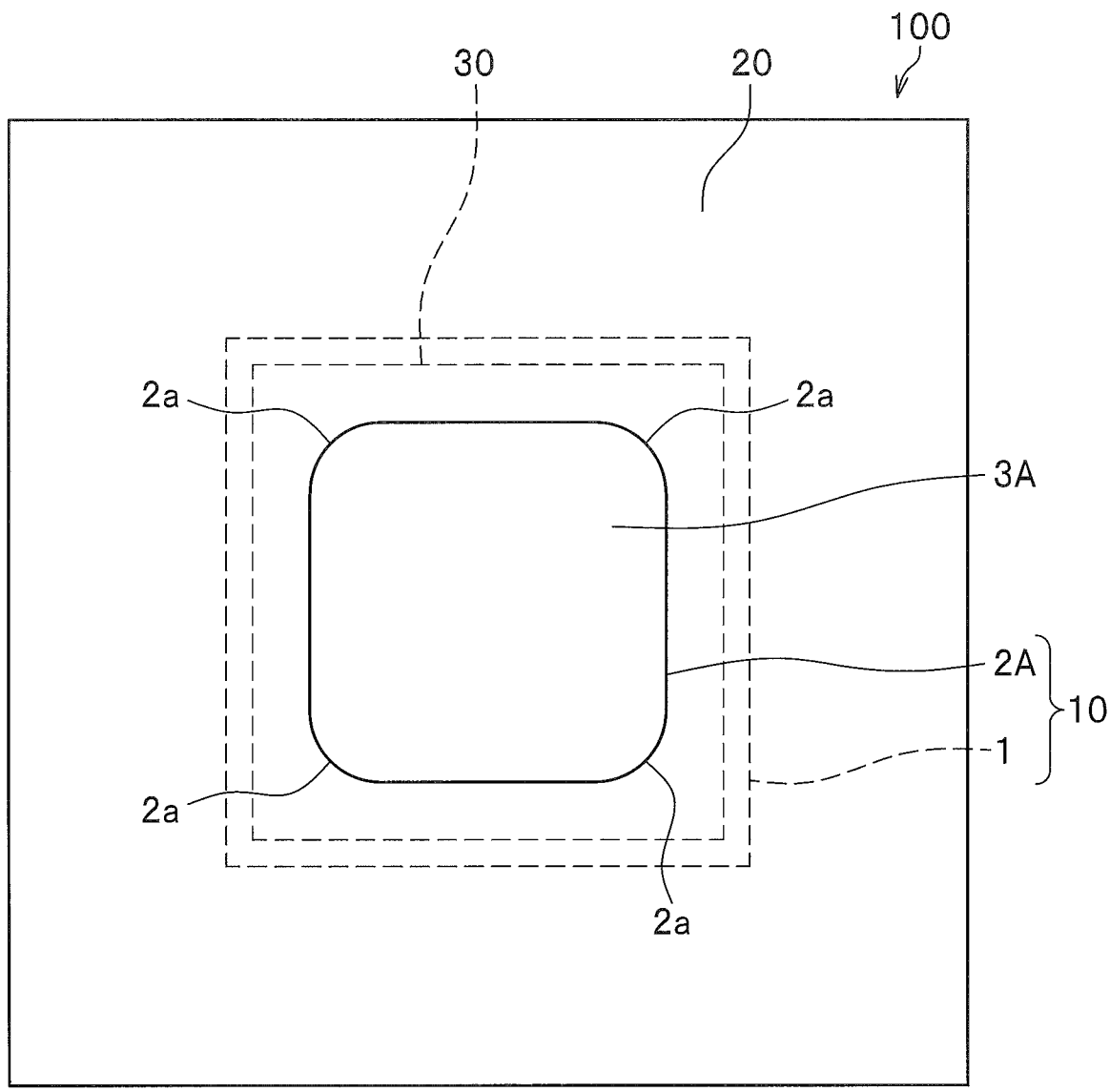

LIGHT-EMITTING DEVICE AND METHOD OF MANUFACTURING THE SAME

CROSS-REFERENCE TO RELATED APPLICATIONS

The present application is a continuation application of the U.S. patent application Ser. No. 15/990,688, filed May 28, 2018, which claims priority under 35 U.S.C. § 119 to Japanese Patent Application No. 2017-107125, filed May 30, 2017. The contents of these applications are incorporated herein by reference in their entirety.

BACKGROUND OF THE INVENTION

1. Field of the Invention

The present invention relates to a light-emitting device and a method of manufacturing the same.

2. Description of Related Art

Light-emitting devices are often used for headlights of vehicles and interior and exterior lighting. For example, a light-emitting device includes a circuit board, a light-emitting element mounted on an upper surface of the circuit board, a phosphor resin layer disposed on an upper surface of the light-emitting element, a diffusion resin layer that is disposed on the upper surface of the phosphor resin layer and diffuses light emitted from the light-emitting element, a first reflective member that is disposed on the upper surface of the circuit board and seals lateral surfaces of the light-emitting element, and a second reflective member surrounding the lateral surfaces of the diffusion resin layer (see WO 2014/081042).

In the above-described light-emitting device, reducing an area of the light-extracting surface allows for enhancing the intensity of light. On the other hand, the phosphor resin layer and the diffusion resin layer are made of resin, so that these layers have large thermal resistances and may be easily deteriorated.

Also, a light-emitting device has been proposed in which a phosphor layer and a light-transmissive layer are made of an inorganic material, such as glass, as a portion of an irradiation surface (for example, see Japanese Unexamined Patent Application Publication No. 2010-283281). This light-emitting device has a structure that allows light emitted from the light-emitting element to be gradually narrowed toward a light-emitting surface, so that light collection efficiency of this light-emitting device can be enhanced.

SUMMARY OF THE INVENTION

A light-emitting device according to one embodiment of the present invention includes a light-emitting element, a first light-transmissive member, and a second light-transmissive member. The light emitting element has a first upper surface serving as a light-extracting surface. The first light-transmissive member includes an inorganic material and a wavelength conversion member. The first light-transmissive member has a plate shape including a first lower surface and a second upper surface. The first lower surface is bonded to the first upper surface of the light-emitting element. An outer periphery of the first lower surface is outside of an outer periphery of the first upper surface of the light emitting element. The second upper surface is opposite to the first lower surface in a height direction along a height of the light-emitting device. The second light-transmissive member includes an inorganic material and includes a second lower surface bonded to the second upper surface of the first light-transmissive member and a third upper surface opposite to the second lower surface in the height direction. An outer periphery of the third upper surface is within an outer periphery of the second upper surface of the first light-transmissive member.

A method of manufacturing a light-emitting device according to an embodiment of the present invention includes providing a first light-transmissive member including an inorganic material and a wavelength conversion member, the first light-transmissive member having a plate shape including a second upper surface and a first lower surface opposite to the second upper surface in a thickness direction along a thickness of the first light-transmissive member; bonding second light-transmissive members to the second upper surface of the first light-transmissive member, each of the second light-transmissive members including an inorganic material; and bonding the first lower surface of the first light-transmissive member to a first upper surface of a light-emitting element, an outer periphery of the first lower surface of the first light-transmissive member being outside of an outer periphery of the first upper surface of the light-emitting element.

A light-emitting device according to an embodiment of the present invention includes light emitting elements, a first light-transmissive member, and a second light-transmissive member. The light-emitting elements have first upper surfaces, respectively. Each of the first upper surfaces serving as a light-extracting surface. The first light-transmissive member includes an inorganic material and a wavelength conversion member. The first light-transmissive member has a plate shape including a first lower surface and a second upper surface. The first lower surface is bonded to the first upper surfaces of the light-emitting elements. An outer periphery of the first lower surface is outside of an outer periphery of the first upper surfaces of the light emitting elements. The second upper surface is opposite to the first lower surface in a height direction along a height of the light-emitting device. The second light-transmissive member includes an inorganic material and includes a second lower surface bonded to the second upper surface of the first light-transmissive member, and a third upper surface opposite to the second lower surface in the height direction. An outer periphery of the second lower surface and an outer periphery of the third upper surface are within an outer periphery of the second upper surface of the first light-transmissive member.

BRIEF DESCRIPTION OF THE DRAWINGS

FIG. 4 is a schematic cross-sectional view for illustrating light emission from the light-emitting device according to the first embodiment.

FIG. 9 is a schematic plan view of a modification of the second light-transmissive member in the first embodiment.

DETAILED DESCRIPTION OF EMBODIMENTS

Figure 1:
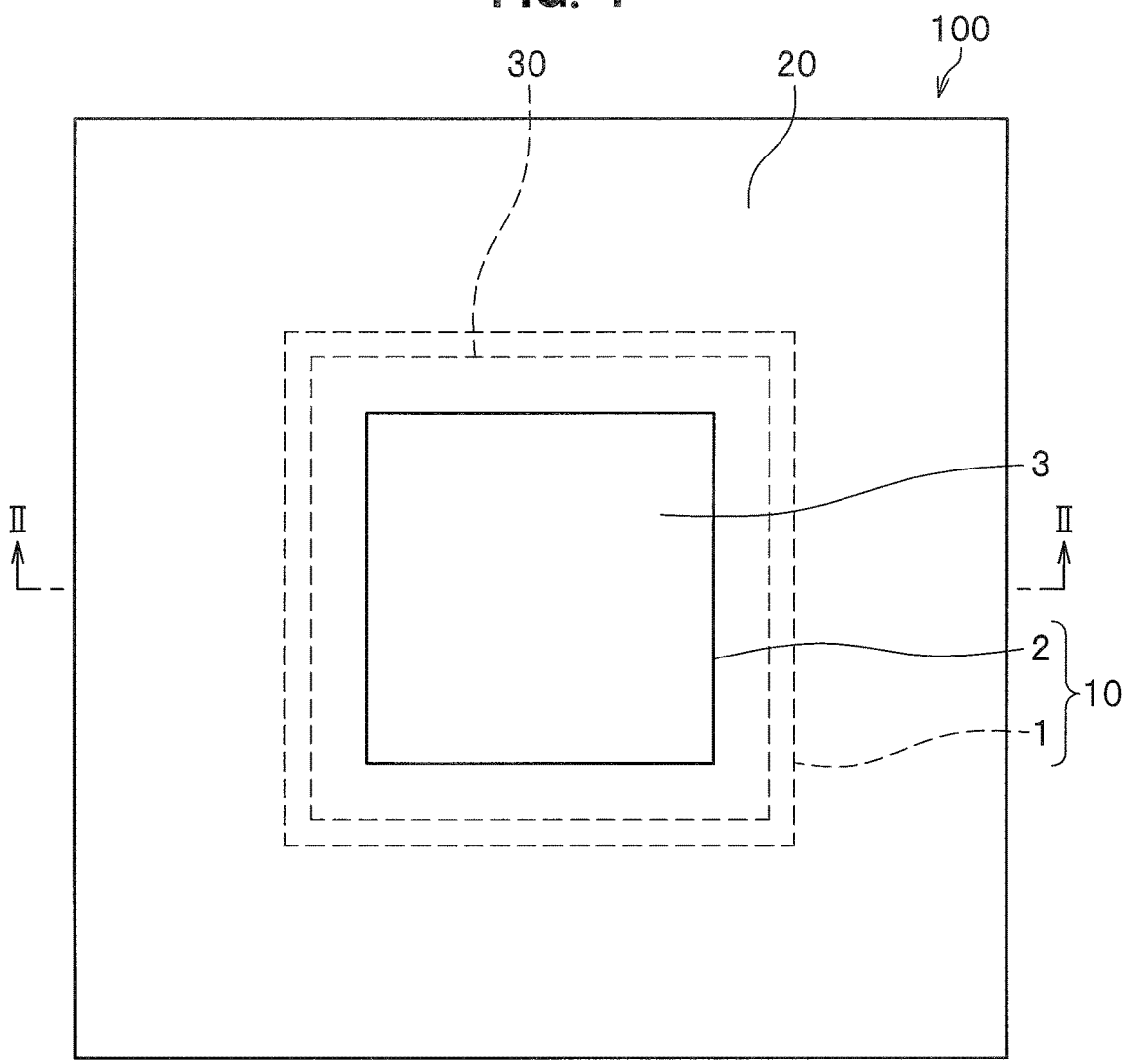
FIG. 1 is a schematic plan view of a light-emitting device according to a first embodiment.

A light-emitting device according to one embodiment will be described below referring to the drawings. The drawings referred to in the descriptions below schematically illustrate the embodiment. The scales, the distances, the positional relations, and the like of members may be exaggerated, or illustration of part of the members may be omitted. In the descriptions below, the same term or reference numeral generally represents the same member or a member made of the same material, and its detailed description will be omitted as appropriate. Furthermore, a direction in each drawing is not intended to indicate absolute positions but represents relative positions of components.

An exemplary structure of the light-emitting device according to a first embodiment will be described referring to FIG. 1 to FIG. 4.

A light-emitting device 100 includes a light-emitting element 30 having an upper surface 31 serving as a light-extracting surface, a first light-transmissive member 1 bonded to the upper surface of the light-emitting element 30 and including an inorganic material as a main component and a wavelength conversion member 11, and a second light-transmissive member 2 bonded to an upper surface 5 of the first light-transmissive member 1 and including an inorganic material as a main component. The periphery of the lower surface of the first light-transmissive member 1 is outward the periphery of the upper surface of the light-emitting element 30 in a plan view, the periphery of the lower surface of the second light-transmissive member 2 is inward the periphery of the upper surface of the first light-transmissive member 1 in a plan view, and the periphery of the upper surface of the second light-transmissive member 2 is inward the periphery of the upper surface of the first light-transmissive member in a plan view.

The first light-transmissive member 1 and the second light-transmissive member 2 constitute an integrated light-transmissive member 10. The light-transmissive member 10 includes the first light-transmissive member 1 and the second light-transmissive member 2 each having an upper surface and a lower surface. The upper surface 5 of the first light-transmissive member and a lower surface 8 of the second light-transmissive member are bonded together to constitute the light-transmissive member 10. Light emitted from the light-emitting element 30 enters through a lower surface 7 of the first light-transmissive member 1 and is emitted to the outside from an upper surface 3 of the second light-transmissive member.

Light-Emitting Element

The light-emitting element 30 is flip-chip mounted on conductor wirings of a substrate 40 via bonding members therebetween. The light-emitting element 30 includes a plurality of electrodes at the same surface side thereof. In the light-emitting element 30, a surface where the electrodes are disposed serves as a lower surface, and the upper surface 31 opposite to the lower surface serves as the main light-extracting surface. A known element can be used for the light-emitting element 30.

For example, a light-emitting diode or a laser diode is preferable. Any appropriate wavelength can be selected as the emission wavelength of the light-emitting element 30. Examples of a blue or green light-emitting element include a light-emitting element including a nitride semiconductor ($In_xAl_yGa_{1-X-Y}N$, $0 \leq X$, $0 \leq Y$, $X+Y \leq 1$) or GaP. For a red light-emitting element, GaAlAs, AlInGaP, or the like can be used as well as a nitride semiconductor element. A semiconductor light-emitting element made of a material other than the above materials can also be used for the light-emitting element 30. The composition, emission color, size, and number of the light-emitting element 30 can be selected appropriately in accordance with the purpose.

The light-emitting element 30 preferably has a pair of positive and negative electrodes on the same surface. This structure enables the light-emitting element 30 to be flip-chip mounted on the substrate 40. In this case, the surface opposite to the surface on which the plurality of electrodes are disposed serves as the main light-extracting surface of the light-emitting element. In the case where the light-emitting element 30 is face-up mounted on the substrate 40, the surface on which the plurality of electrodes are disposed serves as the main light-extracting surface of the light-emitting element 30. The light-emitting element 30 is electrically connected to the substrate 40 via bonding members such as bumps therebetween.

Light-Transmissive Member

The light-transmissive member 10 is bonded to the upper surface 31 of the light-emitting element 30 included in the light-emitting device 100. The light-transmissive member 10 includes the first light-transmissive member 1 and the second light-transmissive member 2 each having the upper surface and the lower surface. The upper surface 5 of the first light-transmissive member and the lower surface 8 of the second light-transmissive member are bonded together to constitute the light-transmissive member 10. For example, the first light-transmissive member 1 is a glass plate containing the wavelength conversion member 11, and the second light-transmissive member 2 is a glass plate.

The light-transmissive member 10 has a protruding shape in which the upper surface 3 of the second light-transmissive member 2 has an area smaller than an area of the lower surface 7 of the first light-transmissive member 1, and lateral surfaces 6 of the first light-transmissive member 1 are located outward of lateral surfaces 4 of the second light-transmissive member 2 in a plan view.

The thickness of the light-transmissive member 10 can be, for example, 60 μm to 300 μm. In the above-described thickness of the light-transmissive member 10, the thickness of the second light-transmissive member 2 is preferably, for example, 50% to 90% of the thickness of the light-transmissive member 10.

First Light-Transmissive Member

The first light-transmissive member 1 is bonded to the upper surface 31 of the light-emitting element 30.

The first light-transmissive member 1 contains the wavelength conversion member and contains an inorganic material as a main component. For example, glass that contains the wavelength conversion member 11 can be used for the first light-transmissive member 1. The first light-transmissive member 1 is, for example, a flat plate having the upper surface 5, the lower surface 7 opposite to the upper surface 5, and the lateral surfaces 6 connected to the upper surface 5 and the lower surface 7.

The lower surface 7 of the first light-transmissive member is irradiated with light emitted from at least one light-emitting element 30 included in the light-emitting device 100. The lower surface 7 of the first light-transmissive member has an area larger than the sum of the areas of the upper surfaces 31 of one or more light-emitting elements 30 bonded to the lower surface 7. The lower surface 7 of the first light-transmissive member is substantially flat.

The plan-view shape of the first light-transmissive member 1 can be appropriately selected in accordance with the shape, number, and arrangement of the light-emitting element described below.

Examples of the plan-view shape of the first light-transmissive member 1 include circles, ellipses, polygons, and other shapes close to these shapes. Among these shapes, a shape corresponding to the outer peripheral shape of the light-emitting element (for example, both the first light-transmissive portion 1 and the plan-view shape of the outer peripheral shape of the light emitting element have substantially rectangular shapes) is preferable. The plan-view shapes of the first light-transmissive member 1 and the second light-transmissive member 2 may be substantially similar or may be different.

The upper surface 5 of the first light-transmissive member is substantially parallel to the lower surface 7 of the first light-transmissive member. The lateral surfaces 6 of the first light-transmissive member are substantially perpendicular to the lower surface 7 of the first light-transmissive member. With the lateral surfaces 6 of the first light-transmissive member substantially perpendicular to the lower surface 7 of the first light-transmissive member, a bonding member 15 that bonds the first light-transmissive member 1 to the light-emitting element 30 can be prevented from creeping up the lateral surfaces 6 of the first light-transmissive member in the manufacturing of the light-emitting device 100. Preventing the adhesive member 15 from creeping up the lateral surfaces 6 of the first light-transmissive member allows for reducing leakage of light emitted from the light-emitting element 30 from without passing through the first light-transmissive member 1 and leaking out.

The lower surface 7 of the first light-transmissive member is larger than the upper surface 31 of the light-emitting element 30 to cover the entirety of the upper surface 31 of the light-emitting element 30. In other words, the periphery of the lower surface 7 of the first light-transmissive member is located outward of the periphery of the upper surface 31 of the light-emitting element 30 in a plan view. With the lower surface 7 of the first light-transmissive member 1 having a larger area than an area of the upper surface 31 of the light-emitting element 30, light emitted from the light-emitting element 30 enters the first light-transmissive member 1 without loss of the light. The lower surface 7 of the first light-transmissive member has a larger area in a range of, for example, 105% to 150% of the sum of the areas of the upper surfaces 31 of one or more light-emitting elements 30 bonded to the lower surface 7. Light emitted from the light-emitting element 30 enters the first light-transmissive member 1 through the lower surface 7 of the first light-transmissive member 1 and enters the second light-transmissive member 2 through the lower surface 8 of the second light-transmissive member.

The first light-transmissive member 1 is made of an inorganic material and contains the wavelength conversion member 11, which can convert wavelength of at least a portion of light emitted from the light-emitting element 30. Examples of the inorganic material include glass such as borosilicate glass, quartz glass, sapphire glass, calcium fluoride glass, aluminoborosilicate glass, oxynitride glass, and chalcogenide glass.

For the wavelength conversion member 11, a phosphor used in the field of the present invention can be selected. In the case where a phosphor is used for the wavelength conversion member 11, for example, phosphor-containing glass, a phosphor-containing ceramic, or a sintered body of the phosphor can be used for the first light-transmissive member 1. Specific examples of the phosphor include cerium-activated yttrium-aluminum-garnet phosphors (YAG:Ce); cerium-activated lutetium-aluminum-garnet phosphors (LAG:Ce); europium- and/or chromium-activated nitrogen-containing calcium aluminosilicate phosphors ($CaO$—$Al_2O_3$—$SiO_2$:Eu, Cr); europium-activated silicate phosphors (($Sr,Ba)_2SiO_4$:Eu); nitride phosphors such as β-SiAlON phosphors, $CaAlSiN_3$:Eu (SCASN phosphors), and $(Sr,Ca)AlSiN_3$:Eu (SCASN phosphors); $K_2SiF_6$:Mn (KSF phosphors); sulfide phosphors; and quantum-dot phosphors.

Various emission colors can be obtained by combining the phosphor with a blue or ultraviolet light-emitting element. To provide a light-emitting device 100 configured to emit white light, the type and concentration of the wavelength conversion member 11 contained in the first light-transmissive member 1 are adjusted so that white light is obtained. The concentration of the wavelength conversion member 11 contained in the first light-transmissive member 1 is, for example, approximately 30% by mass to 80% by mass.

The first light-transmissive member 1 may further contain a light-diffusing material. Examples of the light-diffusing material include titanium oxide, barium titanate, aluminum oxide, and silicon oxide. The wavelength conversion member 11 may be dispersed throughout the first light-transmissive member 1 or may be disposed predominantly at the upper surface or lower surface of the first light-transmissive member 1 in the first light-transmissive member 1.

Second Light-Transmissive Member 2

The second light-transmissive member 2 is bonded to the upper surface of the first light-transmissive member 1. The second light-transmissive member 2 includes an inorganic material as a main component. For example, glass can be used for the second light-transmissive member 2. The second light-transmissive member 2 is, for example, a flat plate having the upper surface 3, the lower surface 8 opposite to the upper surface 3, and the lateral surfaces 4 in contact with the upper surface 3 and the lower surface 8. The lower surface 8 of the second light-transmissive member has an area smaller than an area of the upper surface 5 of the first light-transmissive member. That is, the periphery of the lower surface 8 of the second light-transmissive member 2 is located inward of the periphery of the upper surface 5 of the first light-transmissive member in a plan view, and the periphery of the upper surface 3 of the second light-transmissive member is located inward of the periphery of the upper surface 5 of the first light-transmissive member in a plan view. The area of the upper surface 3 of the second light-transmissive member is preferably smaller than the sum of the areas of the upper surfaces 31 of one or more light-emitting elements 30 included in the light-emitting device 100. In addition, the area of the upper surface 3 of the second light-transmissive member is preferably 70% or less, more preferably 50% or less, of the area of the lower surface 7 of the first light-transmissive member. With the area of the upper surface 3 of the second light-transmissive member is smaller than the area of the lower surface 7 of the first light-transmissive member as described above, light that has been emitted from the light-emitting element 30 and entered the first light-transmissive member through the lower surface 7 of the first light-transmissive member can be emitted through the upper surface 3 of the second light-transmissive member (i.e., light-extracting surface of the light-emitting device 100) having an area smaller than the area of the upper surface 31 of the light-emitting element 30. In other words, with the second light-transmissive member 2, the area of the light extraction surface is reduced, so that the light-emitting device 100 can have a higher luminance and can illuminate a more distant location.

It is preferable that the lateral surfaces 4 of the second light-transmissive member be substantially perpendicular to the upper surface 3 of the second light-transmissive member. With the lateral surfaces 4 substantially perpendicular to the upper surface 3 of the second light-transmissive member, a thickness of the light-reflective member 20 covering the upper surface 5 of the first light-transmissive member 1 exposed from the second light-transmissive member 2 of the light-emitting device 100 can be substantially uniform. The lateral surfaces 4 of the second light-transmissive member are, for example, at an angle in a range of 90°±5° to the upper surface 3 of the second light-transmissive member. This range is regarded as "substantially perpendicular" in the present specification. With the lateral surfaces 4 of the second light-transmissive member are substantially perpendicular to the upper surface 3 of the second light-transmissive member, in the light-emitting device 100, clear boundaries are present between the light-emitting portion and the non-light-emitting portion on the upper surface of the light-emitting device 100, when the upper surface 3 of the second light-transmissive member serves as the light-extracting surface of the light-emitting device 100 can be provided.

A thickness of the second light-transmissive member 2 is preferably, for example, equal to or larger than the thickness of the first light-transmissive member 1. The second light-transmissive member 2 has a thickness of, for example, approximately 30 µm to 270 For example, a glass material can be used for the second light-transmissive member 2. Examples of the glass material include borosilicate glass, quartz glass, sapphire glass, calcium fluoride glass, aluminoborosilicate glass, oxynitride glass, and chalcogenide glass. The upper surface and/or lower surface of the glass material to be used may be anti-reflection-coated (i.e., AR-coated) to prevent reflection. The second light-transmissive member 2 preferably has a refractive index close to the refractive index of the first light-transmissive member 1.

The first light-transmissive member 1 and the second light-transmissive member 2 can be bonded together by bonding using a known adhesive member such as epoxy resins and silicone resins, bonding with an organic adhesive member having a high refractive index, or bonding with low-melting-point glass, preferably by direct bonding without a bonding member such as an adhesive agent. The first light-transmissive member 1 and the second light-transmissive member 2 are both mainly made of an inorganic material and can be directly bonded together by, for example, compression, sintering, surface-activated bonding, atomic diffusion bonding, or hydroxy-group bonding. Direct-bonding between the first light-transmissive member 1 and the second light-transmissive member 2 that are made of the same material allows for reducing reflection due to difference in the refractive indices, so that the light extraction efficiency can be improved.

For example, using an inorganic material such as a glass plate for the second light-transmissive member 2 allows for reducing the thermal resistance of the second light-transmissive member 2 compared with the thermal resistance of a resin material. Accordingly, in the light-emitting device 100 in which the area of emission of light emitted from the light-emitting element is reduced by the second light-transmissive member 2 to have a higher luminance, deterioration over time of the emitting surface due to long-time use can be suppressed.

Adhesive Member

The light-emitting element 30 and the light-transmissive member 10 can be bonded together via, for example, the adhesive member 15. The adhesive member 15 continuously extends from the upper surface of the light-emitting element 30 to at least a portion of each of the lateral surfaces of the light-emitting element 30 and is disposed between the light-reflective member 20 and the lateral surfaces of the light-emitting element 30. The upper surface of the adhesive member 15 disposed between the light-reflective member 20 and the lateral surfaces of the light-emitting element 30 is in contact with the lower surface 7 of the first light-transmissive member. In the case where the adhesive member 15 is used as a bonding member that bonds the light-emitting element 30 to the light-transmissive member 10, light emitted from the light-emitting element 30 propagates through the adhesive member 15 to the lower surface of the light-transmissive member 10. Accordingly, a material that can effectively guide light emitted from the light-emitting element 30 to the light-transmissive member 10 is preferably used for the adhesive member 15. Examples of such a material having a good light-guiding property and the adhesiveness used for the adhesive member 15 include known resin materials such as epoxy resins and silicone resins, organic adhesive members with high refractive indices, inorganic adhesive members, and adhesive members employing low-melting-point glass. The adhesive member 15 preferably extends from the upper surface 31 of the light-emitting element 30 to the lateral surfaces of the light-emitting element 30 to form a fillet 16. The fillet 16 is preferably in contact with both of the lower surface 7 of the first light-transmissive member and the lateral surfaces of the light-emitting element 30 and has curved surfaces concave toward the light-reflective member 20. This shape allows light emitted from the light-emitting element 30 to be reflected from the fillet surfaces of the adhesive member 15 and to be easily guided to the first light-transmissive member 1.

The light-transmissive member 10 and the light-emitting element 30 may be directly bonded together without the adhesive member 15.

Figure 2:
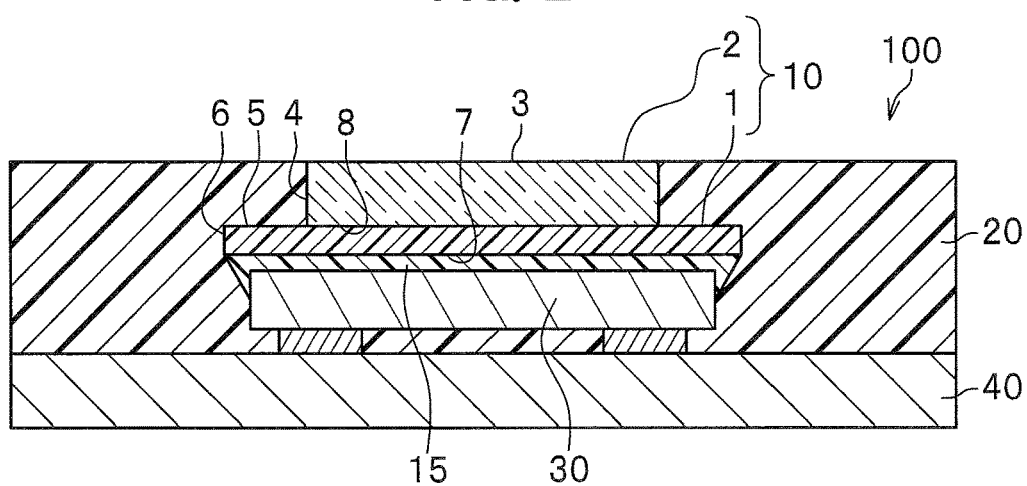
FIG. 2 is a schematic cross-sectional view of the light-emitting device in FIG. 1 taken along the line II-II.

As shown in FIG. 1, FIG. 2, and FIG. 4, the light-reflective member 20 reflects light traveling in directions other than the direction toward the upper surface 3 of the second light-transmissive member to cause the light to be emitted from the upper surface 3 of the second light-transmissive member, and covers the lateral surfaces of the light-emitting element 30 to protect the light-emitting element 30 against external force, dust, and gas. The light-reflective member 20 partially covers the light-transmissive member 10, the light-emitting element 30, and an upper surface of the substrate 40 such that the upper surface 3 of the light-transmissive member 10 (in other words, the upper surface 3 of the second light-transmissive member) is exposed so as to serve as the light-extracting surface of the light-emitting device 100. More specifically, the light-reflective member 20 covers the lateral surfaces 4 of the second light-transmissive member, the upper surface 5 and the lateral surfaces 6 of the first light-transmissive member, the lateral surfaces of the adhesive member 15, and the lateral surfaces and the lower surface of the light-emitting element 30. With the light-extracting surface of the light-emitting element 30 not covered by the light-reflective member 20 and is bonded to the lower surface 7 of the first light-transmissive member, light can enter the light-transmissive member 10. The light-reflective member 20 is made of a member that can reflect light emitted from the light-emitting element 30, which allows the light-reflective member 20 to reflect the light emitted from the light-emitting element 30 at the interface between the light-transmissive member 10 and the light-reflective member 20 to allow the light to enter the light-transmissive member 10. As described above, light emitted from the light-emitting element 30 is reflected at the light-reflective member 20, passes through the light-transmissive member 10, and is emitted to the outside from the upper surface 3 of the second light-transmissive member serving as the light-extracting surface of the light-emitting device 100.

The upper surface of the light-reflective member 20 is preferably located at the position of the same height or lower than the upper surface 3 of the second light-transmissive member. Light emitted from the upper surface 3 of the second light-transmissive member serving as the emission surface of the light-emitting device 100 also spreads in the lateral direction. Thus, if the upper surface of the light-reflective member 20 is located at a position higher than the upper surface 3 of the second light-transmissive member, light emitted from the upper surface 3 of the second light-transmissive member is reflected by the upper surface of the light-reflective member 20, which causes unevenness in the light distribution. Accordingly, the light-reflective member 20 covers the outer periphery of the lateral surfaces 4 of the second light-transmissive member, and the upper surface of the light-reflective member 20 is located at the position of the same height or located at the position lower than the upper surface 3 of the second light-transmissive member. This structure allows light emitted from the light-emitting element 30 to be efficiently extracted out of the light-emitting device 100, and thus is preferable.

The light-reflective member 20 can be formed by mixing a light-reflective substance into a base material made of a silicone resin, a modified silicone resin, an epoxy resin, a modified epoxy resin, an acrylic resin, or a hybrid resin containing at least one of these resins. Titanium oxide, silicon oxide, zirconium oxide, yttrium oxide, yttria-stabilized zirconia, potassium titanate, alumina, aluminum nitride, boron nitride, mullite, or the like can be used for the light-reflective substance. Because an amount of light-reflection and light-transmission of the light-reflective member 20 vary in accordance with the concentration and density of the light-reflective substance, the concentration and density of the light-reflective member 20 can be appropriately adjusted in accordance with the shape and size of the light-emitting device 100. Further, with the light-reflective member 20 made of a material having a heat dissipation property in addition to a light reflecting property, the light-reflective member 20 will have an improved heat dissipation property while having a light reflecting property. Examples of such a material include aluminum nitride and boron nitride, which have high thermal conductivities. The light-reflective member 20 may be made of different materials together.

For example, different materials may be used for a portion of the light-reflective member 20 up to the height of the light-emitting element 30 and a portion of the light-reflective member 20 between the height of the light-emitting element 30 and the height of the light-transmissive member 10.

Substrate

At least one light-emitting element 30 is mounted on the substrate 40, and the substrate 40 electrically connects the light-emitting device 100 to an external device. The substrate 40 includes conductor wiring disposed on the surface of and/or inside a flat plate-shaped supporting member. The shape, size, and other structural factors of the electrodes of the substrate 40 are selected in accordance with the constitution and size of the electrodes of the light-emitting element 30.

An insulating material that hardly transmits light emitted from the light-emitting element 30 and external light is preferably used for the supporting member of the substrate 40. A material having a certain strength is preferably used for the substrate 40. Specific examples of the material include ceramics such as alumina, aluminum nitride, and mullite and resins such as phenolic resins, epoxy resins, polyimide resins, bismaleimide-triazine resins (BT resins), and polyphthalamide (PPA). The supporting member may have a cavity. This structure allows for facilitating formation of the above light-reflective member 20 by dropping and hardening the light-reflective member 20.

For the conductor wiring and a heat radiation terminal, for example, a metal such as Cu, Ag, Au, Al, Pt, Ti, W, Pd, Fe, and Ni or an alloy of these metals can be used. The conductor wiring can be formed by electroplating, electroless plating, vacuum evaporation, sputtering, or the like.

The light-emitting device 100 having the above-described structure allows light emitted from the light-emitting element 30 to be irradiated to a more distant location in the case where, for example, the light-emitting device 100 is used for a headlight of a motorcycle or automobile or the lighting for a ship or aircraft. That is, in the light-emitting device 100, a portion of light emitted from one or more light-emitting elements 30 travels directly to the upper surface 3 of the second light-transmissive member through the light-transmissive member 10 without being reflected by the light-reflective member 20, and another portion of the light is reflected from the light-reflective member 20 before being emitted from the upper surface 3 of the second light-transmissive member. Further, with the area of the lower surface 7 of the first light-transmissive member larger than the sum of the areas of the upper surfaces of the light-emitting elements 30 in the light-emitting device 100, light emitted from the light-emitting elements 30 can be received without loss. In addition, the area of the upper surface 3 of the second light-transmissive member is smaller than the sum of the areas of the upper surfaces 31 of the light-emitting elements 30, and is also smaller than the area of the lower surface 7 of the first light-transmissive member. This allows the light-transmissive member 10 to concentrate light emitted from the light-emitting elements 30 onto the upper surface 3 of the second light-transmissive member. With this structure, the light-emitting device 100 can irradiate light to a more distant location with high luminance and can be suitably used for a high-beam headlight. In FIG. 4, typical directions of radiation of light are schematically indicated by the arrows.

Method of Manufacturing Light-Emitting Device

Figure 5A:
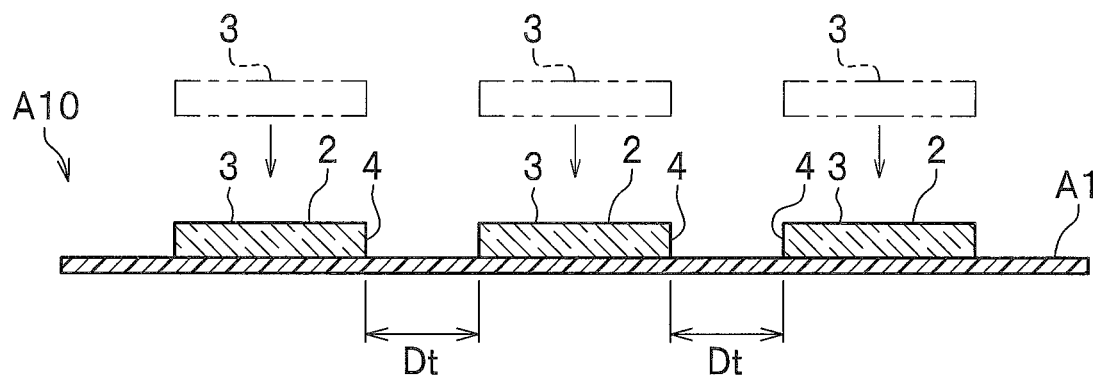
FIG. 5A is a diagram schematically illustrating a light-transmissive member block in which second light-transmissive members are bonded to a first light-transmissive member block in a method of manufacturing the light-emitting device according to the first embodiment.
Figure 5B:
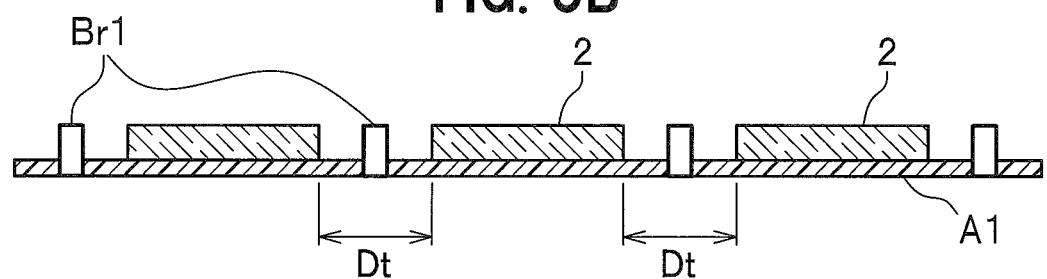
FIG. 5B is a diagram schematically illustrating cutting of the first light-transmissive member block in the method of manufacturing the light-emitting device according to the first embodiment.
Figure 5C:
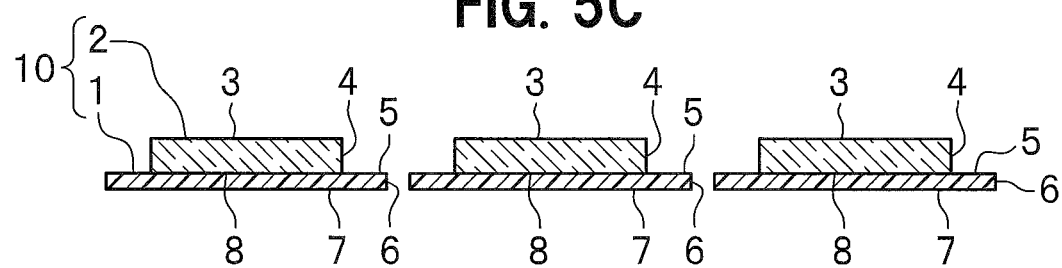
FIG. 5C is a diagram schematically illustrating light-transmissive members separated in the method of manufacturing the light-emitting device according to the first embodiment.

Subsequently, a method S10 for manufacturing the light-emitting device 100 shown in the flowchart in FIG. 6 will be described referring mainly to FIG. 5A to FIG. 5F.

Step S11 of Providing

In Step S11 of providing, a light-transmissive member block A10 is provided. In Step S11 of providing, as shown in FIG. 5A, the light-transmissive member block A10 is provided in which lower surfaces of a plurality of second light-transmissive members 2 are bonded to the upper surface of a first light-transmissive member block A1, which is a flat plate containing the wavelength conversion member 11. For example, the first light-transmissive member block A1 is a wavelength-conversion-member-containing glass plate containing the wavelength conversion member 11 adapted to convert wavelength of a portion of light emitted from the light-emitting element 30. Further, for example, the second light-transmissive member 2 is made of an inorganic material such as a glass material, and is obtained by forming or processing into a substantially rectangular-parallelepiped block. The light-transmissive member block A10 can be formed by directly bonding a plurality of second light-transmissive members 2 formed into a substantial rectangular shape in a plan view to the upper surface of the wavelength-conversion-member-containing glass plate. The first light-transmissive member block A1 and the lower surfaces of the second light-transmissive members 2 may be bonded together via other members such as adhesive members therebetween, but are preferably bonded directly by, for example, compression, sintering, surface-activated bonding, atomic diffusion bonding, or hydroxy-group bonding. In Step S11 of providing, the light-transmissive member block A10 is formed in which a plurality of second light-transmissive members 2 are bonded to the first light-transmissive member block A1, which has a larger area than an area of the second light-transmissive members 2. The second light-transmissive members 2 are preferably aligned on and bonded to the upper surface of the first light-transmissive member block A1. In the present embodiment, the second light-transmissive members 2 are arranged on the upper surface of the first light-transmissive member block A1 at substantially regular intervals Dt in the row direction and/or the column direction.

Step S12 of Forming Light-Transmissive Members

In Step S12 of forming light-transmissive members, individual light-transmissive members 10 each including the first light-transmissive member 1 and the second light-transmissive member 2 are obtained from the light-transmissive member block A10 that is provided. In Step S12 of forming light-transmissive members, the light-transmissive member block A10 including the first light-transmissive member block A1 and the second light-transmissive members 2 is divided at substantially regular intervals to obtain a plurality of light-transmissive members 10 in each of which the lower surface 7 of the first light-transmissive member 1 has an area larger than an area of the upper surface of the light-emitting element 30. In Step S12 of forming light-transmissive members, the light-transmissive member block A10 is divided by cutting the first light-transmissive member block A1 at positions within the intervals Dt using a blade Brl having a width smaller than the interval Dt, as shown in FIG. 5B and FIG. 5C. The periphery of the lower surface 7 of the first light-transmissive member of each divided light-transmissive member 10 is provided such that the lower surface 7 has an area larger than the sum of the areas of the upper surfaces 31 of one or more light-emitting elements 30 included in the light-emitting device 100. The obtained light-transmissive member 10 has a protruding shape in which the upper surface 3 of the second light-transmissive member has an area smaller than the lower surface 7 of the first light-transmissive member. The surfaces created by dividing the first light-transmissive member block A1 constitute the lateral surfaces 6 of the first light-transmissive member in the light-transmissive member 10, and the lateral surfaces 6 of the first light-transmissive member are located outward of the lateral surfaces 4 of the second light-transmissive member in a plan view.

In the case where the first light-transmissive member 1 and the second light-transmissive member 2 are directly bonded together in the light-transmissive member 10, there is little difference in refractive index between the first light-transmissive member 1 and the second light-transmissive member 2 at the interface therebetween.

Providing Substrate and Light-Emitting Elements

In the step of providing the substrate 40 and the light-emitting elements 30, the light-emitting elements 30 and the substrate 40 are provided. The light-emitting elements 30 and the substrate 40 are provided before Step S13 of bonding the light-transmissive members 10.

The substrate 40 is formed into a substantially rectangular flat plate in a plan view. In the substrate 40, for example, the conductor wirings and the heat radiation terminal are disposed on the supporting member.

The light-emitting elements 30 are mounted on the substrate 40. In each light-emitting device 100, a single light-emitting element 30 is mounted on the conductor wirings of the substrate 40 via bonding members such as bumps therebetween.

Step S13 of Bonding

Figure 3:
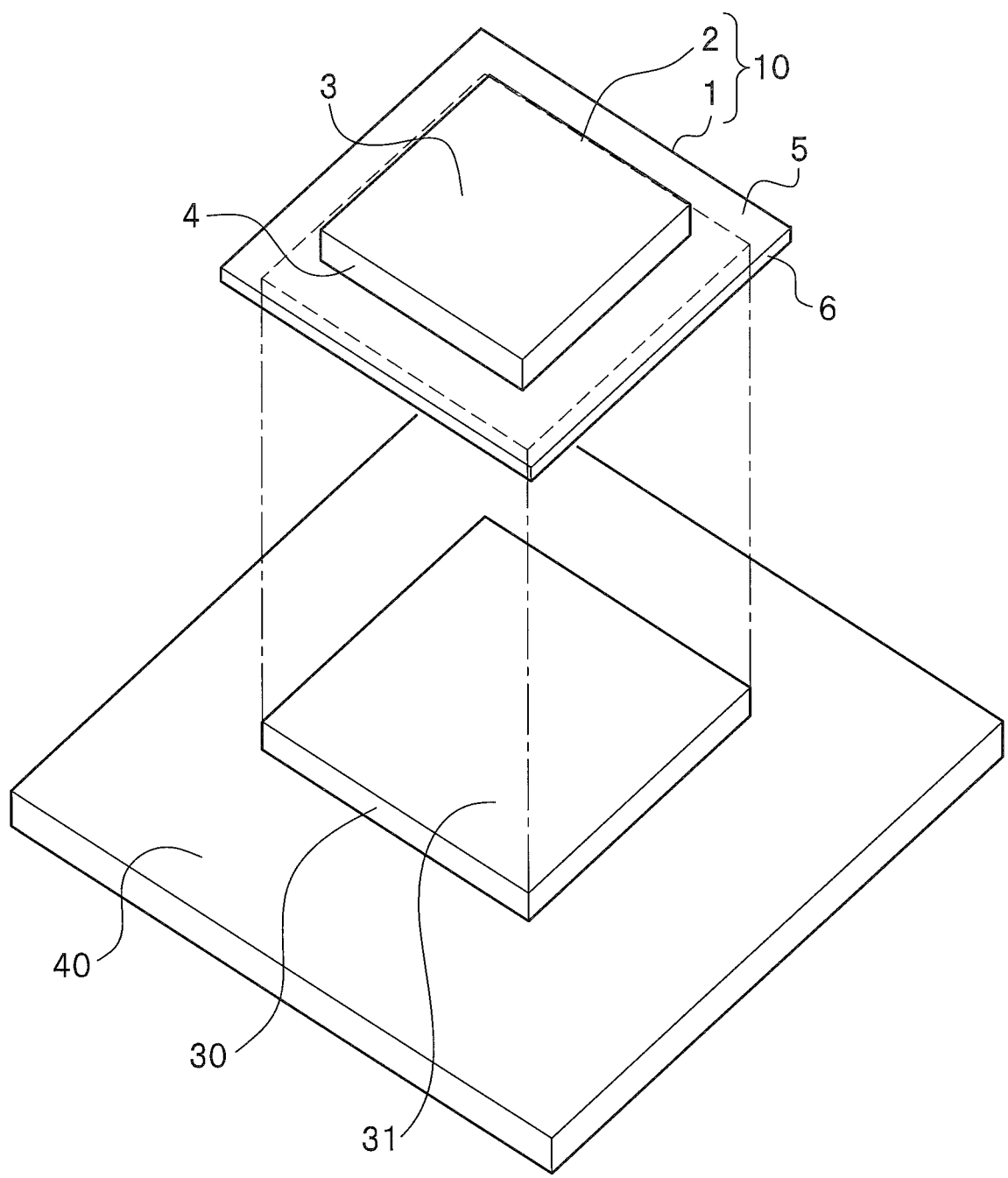
FIG. 3 is a schematic exploded perspective view of the light-emitting device according to the embodiment.
Figure 5D:
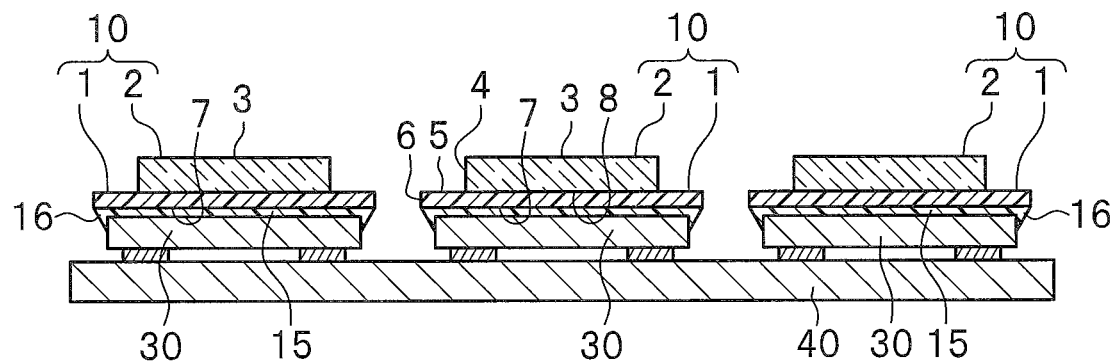
FIG. 5D is a diagram schematically illustrating the light-transmissive members bonded to light-emitting elements in the method of manufacturing the light-emitting device according to the first embodiment.
Figure 6:
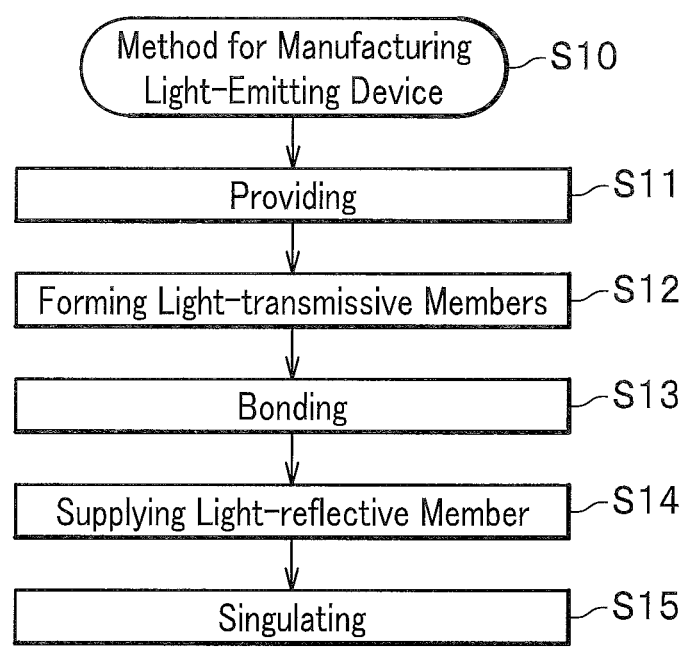
FIG. 6 is a flowchart illustrating the method of manufacturing the light-emitting device according to the first embodiment.

In Step S13 of bonding, each of the light-transmissive members 10 and a respective one of the light-emitting elements 30 are bonded together as shown in FIG. 5D. In Step S13 of bonding, the lower surface of each of the light-transmissive members 10 and the upper surface 31 of a respective one of the light-emitting elements 30 are bonded together such that the periphery of the lower surface of the first light-transmissive member 1 in the light-transmissive member 10 is located outward of the periphery of the upper surface 31 of the light-emitting element 30 as shown in FIG. 3.

The light-emitting element 30 and the light-transmissive member 10 are bonded together via the adhesive member 15. To perform bonding using the adhesive member 15, the adhesive member 15 is dropped on the upper surface 31 of the light-emitting element 30, and the light-transmissive member 10 is then disposed on the adhesive member 15. The dropped adhesive member 15 is pressed by the light-transmissive member 10 and is wet-spread to the lateral surfaces of the light-emitting element 30 to become the fillet 16 between the lower surface of the light-transmissive member 10 and the lateral surfaces of the light-emitting element 30. The amount and viscosity of the adhesive member 15 to be dropped are appropriately adjusted such that the fillet 16 is formed on the lateral surfaces of the light-emitting element 30 and that the adhesive member 15 is not wet-spread to the substrate 40.

The lower surface 7 of the first light-transmissive member in the light-transmissive member 10 is bonded to the light-emitting element 30 via the adhesive member 15 disposed on the upper surface of the light-emitting element 30. The light-transmissive member 10 is preferably formed such that the area of the lower surface 7 of the first light-transmissive member is larger than the sum of the areas of the upper surfaces 31 of one or more light-emitting elements 30 and is preferably arranged such that the distances between the lateral surfaces of the light-emitting elements 30 and the outer periphery of the lower surface 7 of respective first light-transmissive members are equal to one another. Also, the light-transmissive member 10 is preferably disposed such that the center of the upper surface 3 of the second light-transmissive member substantially overlaps the center of an entirety of an arrangement of one or more light-emitting elements 30, which are aligned to form a rectangular shape as a whole in a plan view. In the light-transmissive member 10 bonded to the light-emitting elements 30, the area of the lower surface 7 of the first light-transmissive member is larger than the sum of the areas of the upper surfaces 31 of the light-emitting elements 30. With this structure, light emitted from the upper surfaces of the light-emitting elements 30 can enter the light-transmissive member 10 through the lower surface 7 of the first light-transmissive member, which has an area larger than an area of the upper surfaces 31 of the light-emitting elements 30, and can be guided to the upper surface 3 of the second light-transmissive member, which has an area smaller than an area of the lower surface 7 of the first light-transmissive member and also smaller than an area of the upper surfaces 31 of sum of the one or more the light-emitting elements 30.

Step S14 of Supplying Light-Reflective Member

Figure 5E:
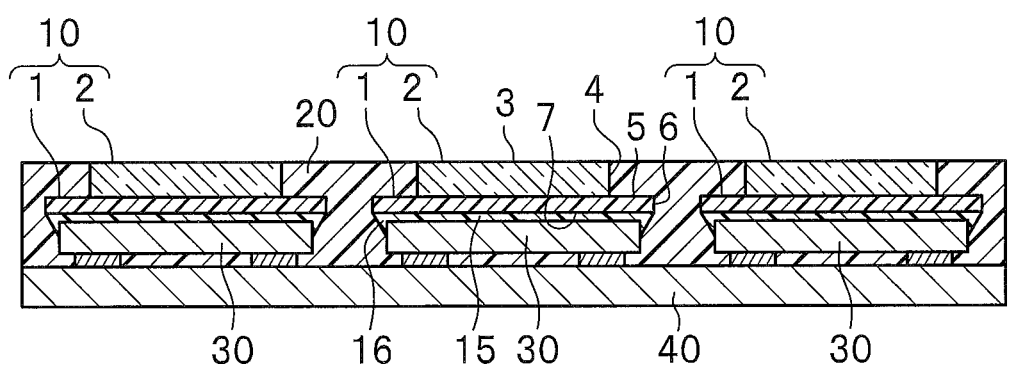
FIG. 5E is a diagram schematically illustrating a light-reflective member disposed surrounding the light-emitting elements and the light-transmissive members in the method of manufacturing the light-emitting device according to the first embodiment.

Subsequently, in Step S14 of supplying a light-reflective member, the light-reflective member 20 is disposed surrounding the light-emitting elements 30 and the light-transmissive members 10 disposed on the substrate 40. In Step S14 of supplying a light-reflective member, the light-reflective member 20 is disposed to cover the light-emitting elements 30, the light-transmissive members 10, and the substrate 40 is disposed as shown in FIG. 5E. The light-emitting device 100 may include one or more types of the light-reflective member 20. In the description below, an example in which the light-reflective member 20 are constituted of two layers will be illustrated.

Supplying First Portion of Light-Reflective Member

A first portion of light-reflective member 20 is supplied to such a height that allows for covering the light-emitting elements 30, the adhesive members 15 on the lateral surfaces of the light-emitting elements 30, and the gaps between the light-emitting elements 30 and the substrate 40. In the case where the light-reflective member 20 is disposed between the light-emitting elements 30 and the substrate 40, a material with a low linear expansion is preferably used for the light-reflective member 20. This structure allows for reducing thermal stress on junctions between the light-emitting elements 30 and the substrate 40.

Supplying Second Portion of Light-Reflective Member

Subsequently, a second portion of the light-reflective member 20 is supplied to cover the lateral surfaces of the light-transmissive members 10. The second portion of the light-reflective member 20 covers the lateral surfaces 4 of the second light-transmissive members and the upper surfaces 5 and the lateral surfaces 6 of the first light-transmissive members. At this time, the light-reflective member 20 is preferably dropped onto the upper surface of the substrate 40 apart from the light-transmissive members 10 so that the upper surfaces 3 of the second light-transmissive members are exposed from the light-reflective member 20. The second portion of the light-reflective member 20 is supplied to cover a surface of the first surface of the light-reflective member 20 that has been supplied.

For example, a resin containing titanium oxide mixed in a silicone resin is used for the light-reflective member 20.

Step S15 of Singulating

Figure 5F:
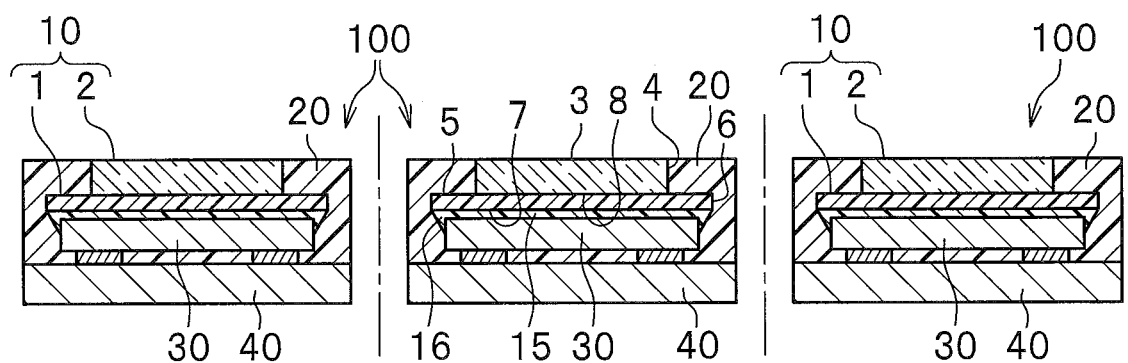
FIG. 5F is a diagram schematically illustrating a state where cutting into individual light-emitting devices has been performed in the method of manufacturing the light-emitting device according to the first embodiment.

In Step S15, singulation into individual light-emitting devices 100 is performed. In Step S15 of separating after the formation of the light-reflective member 20, the substrate 40 is cut into individual light-emitting devices by laser irradiation or using a tool such as a blade to form the light-emitting devices 100 as shown in FIG. 5F.

In each light-emitting device 100 manufactured through the above-described steps, light emitted from one or more light-emitting elements 30 can be incident on the lower surface 7 of the first light-transmissive member having an area larger than the sum of the areas of the upper surfaces 31 of the one or more light-emitting elements 30, and can be emitted from the upper surface 3 of the second light-transmissive member having an area smaller than an area of the lower surface 7 of the first light-transmissive member as a light with a high luminance.

Further, in the case where the first light-transmissive member 1 and the second light-transmissive member 2 are directly bonded together, the direct bonding allows for achieving strong bonding between the first light-transmissive member 1 and the second light-transmissive member 2 and little change in the refractive index, so that deterioration due to heat generated from the light-emitting elements 30 can be reduced. Also, with the light-transmissive member 10 made of a glass material, the irradiation surface of the light-emitting device 100 does not easily deteriorate, and the light-emitting device 100 has good product quality.

In Step S14 of supplying a light-reflective member, the case of supplying two different portions of a reflective member is described, but the light-reflective member 20 may be integrally supplied.

Variant Example

Figure 7:
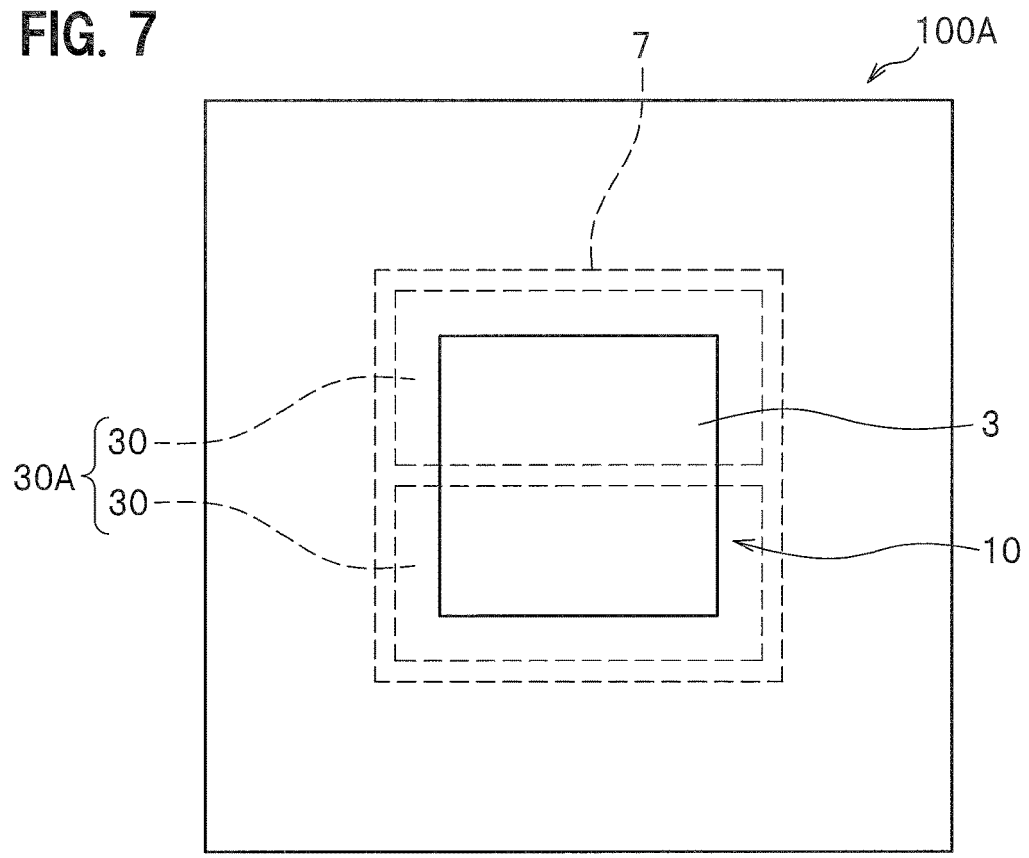
FIG. 7 is a schematic plan view of a light-emitting device according to a variant example of the first embodiment.
Figure 8:
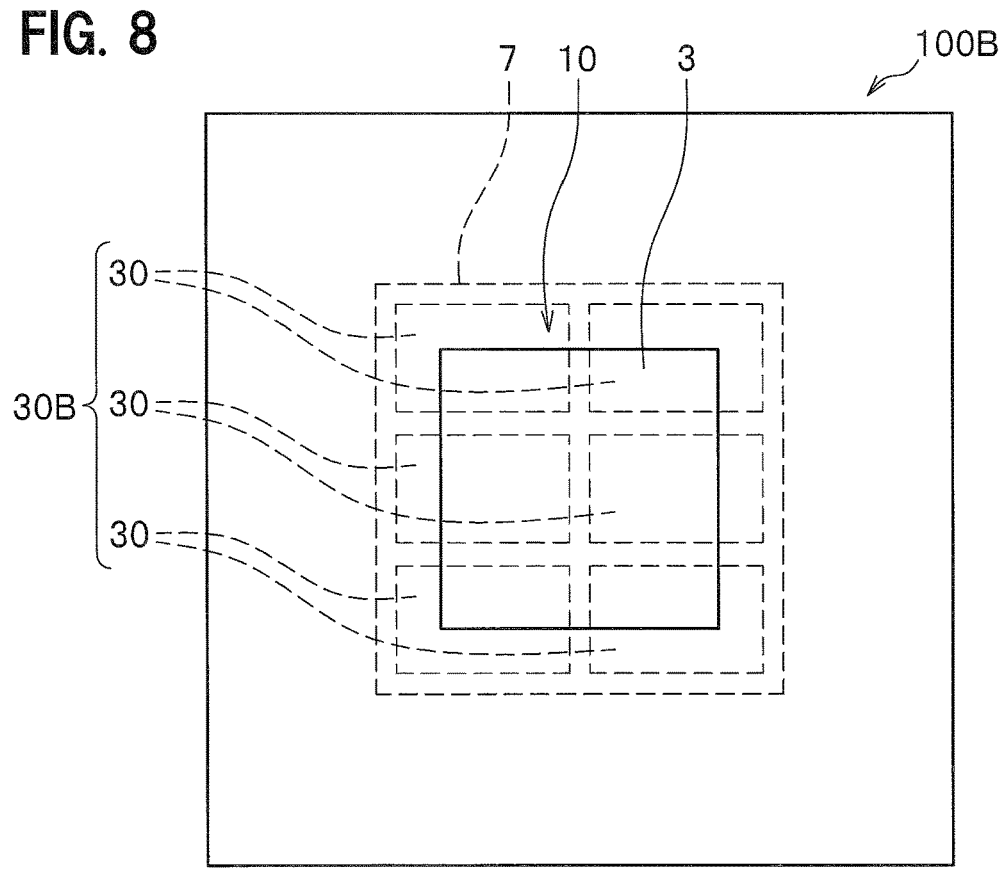
FIG. 8 is a schematic plan view of a light-emitting device according to another variant example of the first embodiment.

A light-emitting element array 30A or 30B including a plurality of light-emitting elements 30 may be included in a light-emitting device 100A or 100B as shown in FIG. 7 and FIG. 8. Elements of this structure will be described below. The structure of the light-emitting device 100 and the method of manufacturing the light-emitting device 100 that have been described above will be described using the same reference numerals, and their detailed descriptions will be omitted as appropriate.

The light-emitting device 100A may include the light-emitting element array 30A of including a plurality of light-emitting elements 30. For example, the light-emitting element array 30A includes two light-emitting elements 30 of the same size that are aligned to be adjacent to each other as shown in FIG. 7. In the case where the light-emitting elements 30 are arranged adjacent to each other, the light-transmissive member 10 is formed such that the lower surface 7 of the first light-transmissive member is larger than an area of the light-emitting element array 30A, which is the total area of the light-emitting elements 30 arranged in a row. The "area of the light-emitting element array 30A" refers to an area of the region enclosed by a rectangle made of straight lines surrounding the two light-emitting elements 30, and the region between the light-emitting elements 30 is regarded as a portion of the area of the upper surface of the light-emitting element array 30A. The light-transmissive member 10 is formed such that the area of the upper surface 3 of the second light-transmissive member is smaller than the area of the light-emitting element array 30A. In the light-emitting device 100A having such a structure, light emitted from a plurality of light-emitting elements 30 can be incident on the lower surface 7 of the first light-transmissive member and be emitted to the outside from the upper surface 3 of the second light-transmissive member having an area smaller than an area of the lower surface 7 of the first light-transmissive member, so that light can be irradiated to a distant location with higher luminance.

Alternatively, for example, six light-emitting elements 30 may be arranged to form the light emitting element array 30B of light-emitting elements as shown in FIG. 8. With this arrangement, the light-transmissive member 10 is formed such that the lower surface 7 of the first light-transmissive member is has an area larger than an area of the light-emitting element array 30B, which is the total area of the six light-emitting elements 30 arranged in rows. The "area of the light-emitting element array 30B" refers to the region enclosed by a rectangle made of straight lines surrounding the six light-emitting elements 30, and the region between the light-emitting elements 30 is regarded as a portion of the area of the upper surfaces of the light-emitting element array 30B. The light-transmissive member 10 is formed such that the area of the upper surface 3 of the second light-transmissive member is smaller than the area of the light-emitting element array 30B. Also in the light-emitting device 100B having such a structure, light emitted from a plurality of light-emitting elements 30 can be incident on the lower surface 7 of the first light-transmissive member, and be emitted to the outside from the upper surface 3 of the second light-transmissive member having an area smaller than an area of the lower surface 7 of the first light-transmissive member, so that light can be irradiated to a distant location with higher luminance.

The light-emitting device 100 includes at least one light-emitting element 30. The light-emitting device 100 may include two or six light-emitting elements 30 as described above, or may include three, four, five, or seven or more light-emitting elements 30.

In the case where the light-emitting device 100 includes a plurality of light-emitting elements 30, the light-emitting element array (that is, the light-emitting elements 30) preferably forms a substantially rectangular shape as a whole in a plan view. In the case where the lower surface 7 of the first light-transmissive member 1 is bonded to the upper surfaces of the light-emitting element array via the adhesive member therebetween, the adhesive member preferably extends to the lateral surfaces facing each other of adjacent light-emitting elements 30. This structure allows for reducing unevenness in color and luminance between the light-emitting elements 30.

Also, descriptions have been made on the second light-transmissive member 2 having a substantially rectangular-parallelepiped shape, but the second light-transmissive member 2 may have, for example, a cylindrical shape, an elliptic cylindrical shape, or a prismatic shape with rounded corners. The light-reflective member may tend to deteriorate due to light and heat around the lateral surfaces of an upper part (i.e., second light-transmissive member 2) of the light-transmissive member having a rectangular shape in a plan view and a protruding shape in a cross-sectional view. In view of this, with the second light-transmissive member 2 having rounded corners, deterioration of the light-reflective member is supposed to be suppressed. Accordingly, it is more preferable to have a shape in which each corner 2a of an upper surface 3A of a second light-transmissive member 2A is rounded, as in the second light-transmissive member 2A shown in FIG. 9. The shape of the rounded corner 2a of the light-transmissive member 2A is indicated by a curved line in FIG. 9. The light-transmissive member 2A may have a polygonal shape in a top view, with each corner formed by one or more straight-ling segments each connecting two vertices. In the method of manufacturing according to the present disclosure, a plurality of second light-transmissive members 2 that have been processed are bonded to the first light-transmissive member, the second light-transmissive member 2A having corners which have been rounded can be used, so that the light-transmissive member 10 having a shape that allows the light-reflective member to be less easily deteriorated can be manufactured.

Also, descriptions have been made on the lower surface 8 of the second light-transmissive member having a size different from a size of the upper surface 5 of the first light-transmissive member in the above-described light-emitting device, but, with the lower surface 8 of the second light-transmissive member and the upper surface 5 of the first light-transmissive member having the same size, the upper surface 3 of the second light-transmissive member may be located inward of the upper surface 5 of the first light-transmissive member. This structure allows for facilitating guiding of light from the upper surface 5 of the first light-transmissive member to the lower surface 8 of the second light-transmissive member, so that the light extraction efficiency of the light-emitting device 100 can be improved. In addition, in the case where a plurality of light-emitting elements 30 are bonded to a single light-transmissive member 10, effects on arrangement of the light-emitting elements 30 and their resulting effects on light distribution and unevenness in luminance and color are reduced, and thus is preferable. In addition, the adhesive member 15 bonding the light-transmissive member 10 to the light-emitting elements 30 may contain the wavelength conversion member 11, the light-diffusing material, and the like. In addition, in the case where a plurality of light-emitting elements 30 are mounted, each of the light-transmissive members 10 may be bonded to a respective one of the light-emitting elements 30.

In the light-emitting device 100 according to certain embodiments of the present invention, a protective element such as a Zener diode may be mounted on the substrate 40. Embedding the protective element in the light-reflective member 20 allows for preventing reduction in light extraction due to absorption or blocking of light from the light-emitting elements 30 by the protective element.

In addition, in the case where two light-emitting elements 30 are used, the interval between the two light-emitting elements 30 is preferably such an interval that the fillet 16 formed of the adhesive member 15 is continuously formed between the two light-emitting elements 30. More specifically, in the case where the light-emitting device 100 includes two or more light-emitting elements 30, the distance between adjacent light-emitting elements 30 is preferably twice the thickness of the light-emitting elements 30 or less.

Also, in the method of manufacturing the light-emitting device according to certain embodiments of the present invention, breakage of components during the manufacturing operation can be greatly reduced, and leakage of light from a portion surrounding the light-extracting surface can be greatly prevented.

The light-emitting device according to the embodiments of the present invention can be used for a light source of a headlight of a vehicle such as motorcycles and automobiles, ships, or aircraft. Other applications include various light sources such as light sources for various types of lighting including spotlights, light sources for display devices, and vehicle components.

What is claimed is:

1. A light-emitting device comprising:
   a light-emitting element having a first upper surface serving as a light-extracting surface;
   a first light-transmissive member including an inorganic material and a wavelength conversion member, the first light-transmissive member having a plate shape comprising:
      a first lower surface bonded to the first upper surface of the light-emitting element, an outer periphery of the first lower surface being outside of an outer periphery of the first upper surface of the light-emitting element; and
      a second upper surface opposite to the first lower surface in a height direction along a height of the light-emitting device; and
   a second light-transmissive member including an inorganic material and comprising:
      a second lower surface bonded to the second upper surface of the first light-transmissive member; and
      a third upper surface opposite to the second lower surface in the height direction, an outer periphery of the third upper surface being within an outer periphery of the second upper surface of the first light-transmissive member.

2. The light-emitting device according to claim 1, wherein an area of the third upper surface of the second light-transmissive member is smaller than an area of the first upper surface of the light-emitting element.

3. The light-emitting device according to claim 1, wherein the first light-transmissive member and the second light-transmissive member is made of borosilicate glass, sapphire glass, or quartz glass.

4. The light-emitting device according to claim 1, wherein the first light-transmissive member and the second light-transmissive member are directly bonded together.

5. The light-emitting device according to claim 1, wherein the first light-transmissive member and the light-emitting element are bonded together via an adhesive member.

6. The light-emitting device according to claim 1, the light-emitting device further comprising a light-reflective member covering lateral surfaces of the light-emitting element, lateral surfaces of the first light-transmissive member, and lateral surfaces of the second light-transmissive member.

7. The light-emitting device according to claim 1, wherein the second light-transmissive member has a larger thickness than a thickness of the first light-transmissive member.

8. The light-emitting device according to claim 1, wherein the first light-transmissive member includes a light-diffusing material.

9. The light-emitting device according to claim 1, wherein the second light-transmissive member has a thickness of about 30 μm to 270 μm.

10. The light-emitting device according to claim 1, wherein a planar shape of the second light-transmissive member is a polygonal shape with a rounded corner.

11. A light-emitting device comprising:
    light-emitting elements having first upper surfaces, respectively, each of the first upper surfaces serving as a light-extracting surface;
    a first light-transmissive member including an inorganic material and a wavelength conversion member, the first light-transmissive member having a plate shape comprising:
       a first lower surface bonded to the first upper surfaces of the light-emitting elements, an outer periphery of the first lower surface being outside of an outer periphery of the first upper surfaces of the light emitting elements; and
       a second upper surface opposite to the first lower surface in a height direction along a height of the light-emitting device; and
    a second light-transmissive member including an inorganic material and comprising:
       a second lower surface bonded to the second upper surface of the first light-transmissive member; and
       a third upper surface opposite to the second lower surface in the height direction, an outer periphery of the second lower surface and an outer periphery of the third upper surface being within an outer periphery of the second upper surface of the first light-transmissive member.

12. The light-emitting device according to claim 11, wherein an area of the third upper surface of the second light-transmissive member is smaller than an area of the first upper surfaces of the light-emitting elements.

13. The light-emitting device according to claim 11, wherein the light-emitting elements form a substantially rectangular shape as a whole in the plan view.

14. The light-emitting device according to claim 11, wherein a planar shape of the second light-transmissive member is a polygonal shape with a rounded corner.

15. A method of manufacturing a light-emitting device, the method comprising:

provoding a first light-transmissive member including an inorganic material and a wavelength conversion member, the first light-transmissive member having a plate shape comprising a second upper surface and a first lower surface opposite to the second upper surface in a thickness direction along a thickness of the first light-transmissive member;

bonding second light-transmissive members to the second upper surface of the first light-transmissive member, each of the second light-transmissive members including an inorganic material; and bonding the first lower surface of the first light-transmissive member to a first upper surface of a light-emitting element, an outer periphery of the first lower surface of the first light-transmissive member being outside of an outer periphery of the first upper surface of the light-emitting element.

16. The method of manufacturing a light-emitting device according to claim 15, the method further comprising mounting the light-emitting element on a substrate.

17. The method of manufacturing a light-emitting device according to claim 15, the method further comprising disposing a light-reflective member to cover lateral surfaces of the second light-transmissive members, lateral surfaces of the first light-transmissive member, and lateral surfaces of the light-emitting element.

18. The method of manufacturing a light-emitting device according to claim 15, wherein the first light-transmissive member and the second light-transmissive members comprise borosilicate glass, sapphire glass, or quartz glass.

19. The method of manufacturing a light-emitting device according to claim 15, wherein the direct bonding is performed by surface-activated bonding, atomic diffusion bonding, or hydroxy-group bonding.

20. The light-emitting device according to claim 1, wherein the first light-transmissive member has a rectangular parallelepiped shape.

* * * * *